United States Patent
Böhm et al.

(10) Patent No.: US 6,258,658 B1
(45) Date of Patent: Jul. 10, 2001

(54) MEMORY CELL CONFIGURATION AND CORRESPONDING FABRICATION METHOD

(75) Inventors: Thomas Böhm, Zorneding; Volker Weinrich, München; Manfred Hain, Vaterstetten; Armin Kohlhase, Neubiberg; Yoichi Otani, Weixdorf; Andreas Rusch, Dresden; Till Schlösser, München, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/250,362

(22) Filed: Feb. 12, 1999

(30) Foreign Application Priority Data

Feb. 12, 1998 (DE) .............................. 198 05 712

(51) Int. Cl.⁷ .............................................. H01L 21/8242
(52) U.S. Cl. ............................................ 438/243; 438/386
(58) Field of Search .................................. 438/239, 242, 438/243, 244, 245, 246, 247, 248, 249, 386, 387, 388, 389, 390, 391, 392

(56) References Cited

U.S. PATENT DOCUMENTS

| | | | |
|---|---|---|---|
| 4,958,206 | * | 9/1990 | Teng et al. ............................. 357/23 |
| 5,389,559 | * | 2/1995 | Hsieh et al. ........................... 438/243 |
| 5,714,779 | * | 2/1998 | Auer et al. ............................. 257/306 |

FOREIGN PATENT DOCUMENTS

| | | |
|---|---|---|
| 19510042A1 | 9/1996 | (DE) . |
| 19519159A1 | 11/1996 | (DE) . |
| 19514834C1 | 1/1997 | (DE) . |
| 19543539C1 | 4/1997 | (DE) . |

* cited by examiner

Primary Examiner—David Nelms
Assistant Examiner—David Nhu
(74) Attorney, Agent, or Firm—Herbert L. Lerner; Laurence A. Greenberg; Werner H. Stemer

(57) ABSTRACT

The memory cell configuration has a multiplicity of preferably ferroelectric memory cells in a semiconductor substrate. Mutually parallel bit line trenches run in the longitudinal direction in the main surface of the semiconductor substrate. Bit lines are disposed in the bottoms of the trenches. Source/drain regions are formed in the crowns of the trenches. Channel regions are provided in the walls of the trenches. The channel region on a wall in each case is configured such that a drivable selection transistor of the relevant memory cell is formed there, while the channel region on the other wall is configured such that the transistor located there is closed. Insulated word lines for driving the selection transistors run in the transverse direction along the main surface of the semiconductor substrate through the bit line trenches. Insulation trenches for insulating the source/drain regions in the longitudinal direction of neighboring memory cells run in the transverse direction in the main surface of the semiconductor substrate. A respective, preferably ferroelectric, capacitor is connected to the source/drain region of the respective memory cell and is arranged above the word lines.

16 Claims, 3 Drawing Sheets

ововCELL CONFIGURATION AND CORRESPONDING FABRICATION METHOD

BACKGROUND OF THE INVENTION

Field of the Invention

The invention lies in the semiconductor field. Specifically, the present invention relates to a memory cell configuration with a multiplicity of preferably ferroelectric memory cells provided in a semiconductor substrate (ferroelectric memory (FeRAM) or nonvolatile random-access memory (NVRAM)) and to a corresponding fabrication method.

Although applicable to memories made of any desired base material, the present invention and also the problems on which it is based are explained with regard to a silicon-based memory.

In general, a DRAM memory is formed from a memory cell configuration whose individual memory cells have a selection transistor and a capacitor connected thereto. A memory cell of a ROM memory consists of only a transistor.

In the beginning, memory cell configurations were based on predominantly planar designs. With the stipulation of a constantly increasing packing density, a proposal has already been made for mask ROM applications (read-only memory) which envisages folding the cell area of the memory by introducing parallel longitudinal trenches and thus reducing the cell area when projected onto the wafer surface by up to 50%. The utilization of the vertical direction in the form of capacitances as trench or stacked capacitor is known in the case of DRAMs.

German patent DE 195 14 834 discloses a read-only memory cell configuration having first memory cells with a vertical MOS transistor and second memory cells without a vertical MOS transistor. The memory cells are arranged along opposite sidewalls of mutually parallel strip-type insulation trenches. If the width and spacing of the insulation trenches are chosen to be identical, then the minimum space requirement per memory cell is theoretically $2F^2$, where F is the minimum structure size of the manufacturing technology.

German published patent application DE 195 10 042 discloses a read-only memory cell configuration in which the memory cells are arranged in parallel rows. Longitudinal trenches run essentially parallel to the rows. In this case, the rows are respectively arranged alternately on the main area between neighboring longitudinal trenches and on the bottom of the longitudinal trenches. Insulation structures are provided for mutual insulation of the memory cells, which each comprise a MOS transistor. Word lines run transversely with respect to the rows and are each connected to the gate electrodes of MOS transistors arranged along different rows. In this case, the minimum space requirement per memory cell is theoretically $4F^2$, where F is the minimum structure size of the respective technology.

The commonly assigned, copending application No. 08/755,456, which corresponds to the German published patent application DE 195 43 539, discloses a RAM memory cell configuration having a vertical storage capacitor with a ferroelectric or paraelectric storage dielectric. In order to fabricate the storage capacitor, a dielectric layer for the storage dielectric is produced in a large-area manner. The dielectric layer is subsequently structured, and first and second electrodes are formed for the storage capacitors.

The storage dielectric used in accordance with the disclosure of the copending application is ferroelectric material for nonvolatile memories, since that material has spontaneous polarization which is present even in the absence of an external electric field. Paraelectric material, on the other hand, is used in DRAM applications, in which a refresh cycle is provided.

In practice, however, the known designs for memory cells comprising a selection transistor and a storage capacitance (for example DRAM) at present only enable cell sizes for a memory cell of 9.6 $F^2$. The aim is a cell size of 8 $F^2$ starting with the 1 Gb generation, where F=0.18 μm.

SUMMARY OF THE INVENTION

It is accordingly an object of the invention to provide a memory cell configuration having preferably ferroelectric memory cells, which overcomes the above-mentioned disadvantages of the heretofore-known devices and methods of this general type and which can be fabricated simply and reliably. It is a further object to provide a corresponding fabrication method.

With the foregoing and other objects in view there is provided, in accordance with the invention, a memory cell configuration, comprising:

a semiconductor substrate having a main surface with a multiplicity of, preferably ferroelectric, memory cells;

a plurality of mutually parallel bit line trenches extending in a longitudinal direction in said main surface of said semiconductor substrate, said bit line trenches having bottoms with respective bit lines provided therein, crowns formed with respective source/drain regions, and walls with respective channel regions;

wherein said channel region on a first wall of a respective said trench forms a drivable selection transistor of a respective one of said memory cells, and said channel region on a second wall forms a closed transistor;

insulated word lines for driving said selection transistors extending in a transverse direction along said main surface of said semiconductor substrate through said bit line trenches;

insulation trenches extending in the transverse direction along said main surface of said semiconductor substrate, said insulation trenches insulating said source/drain regions of longitudinally adjacent memory cells; and a plurality of capacitors each connected to said source/drain region of a respective memory cell and disposed above said word lines.

The inventive memory cell configuration having ferroelectric memory cells has the advantage over known memory cell configurations that it has an achievable minimum cell size of 6 $F^2$.

In contrast to the customary method for fabricating a DRAM with a stacked capacitor, the bit line in the memory cell configuration according to the invention is no longer situated between source/drain region and capacitor. This means that the aspect ratio for the contact plug, which provides for the connection of the capacitor to the selection transistor, is distinctly relaxed. In order to connect the bit line, the same is passed up with a diffusion contact to the original level of the semiconductor substrate, with the result that here, too, a relaxed aspect ratio is produced for the contact holes. The contact plugs can be embodied in a self-aligned manner. Otherwise, it is likewise possible to have recourse exclusively to customary process steps.

The idea on which the present invention is based consists in implementing the selection transistor as a vertical transistor on a trench wall, the opposite trench wall being configured in such a way that the transistor located there is always closed, that is to say its threshold voltage is beyond the supply voltage. The planar base area for the ferroelectric capacitance is 2 $F^2$. This size can be realized without any technical difficulties in the fabrication method specified. A further increase in the capacitor area can be obtained by utilizing the side areas of the lower electrode.

In accordance with an added feature of the invention, the respective channel region of the wall opposite the selection transistor is doped in such a way that the transistor located there is always closed, that is to say its threshold voltage is beyond the supply voltage. In this way, it is possible to define a selection transistor by way of the channel doping, that is to say by way of the definition of the threshold voltage.

In accordance with an additional feature of the invention, an oxide layer is provided between the source/drain regions and the channel regions, on the one hand, and the respective word line on the other hand. In this way, it is possible to obtain good electrical insulation of the word lines with respect to the source/drain regions and the channel regions.

In accordance with another feature of the invention, the word lines have laterally insulating spacers made of silicon oxide or silicon nitride.

In accordance with a further preferred development, the word lines have an insulating spacer made of silicon oxide or silicon nitride on their top side.

In accordance with yet an added feature of the invention, the word lines are completely embedded in an insulator layer, which preferably has doped silicate glass. This layer is advantageous as a carrier for the cell capacitors. It may also be a double layer of which the upper layer is an undoped oxide, for example.

In accordance with yet an additional feature of the invention, contact plugs are passed through the insulator layer, which plugs each form contact with a source/drain region of a selection transistor of a relevant memory cell. If the word lines are completely encapsulated with insulating material, then it is possible to effect the connection of the source/drain regions on the trench crowns by a self-aligned polysilicon contact plug process.

In accordance with yet another feature of the invention, the contact plugs are provided on the crowns of the bit line trenches in the zone between the insulation trenches and the word lines.

In accordance with yet again an added feature of the invention, a corresponding lower capacitor electrode is provided, preferably with an interposed barrier layer, in conjunction with the respective contact plug on the insulator layer.

In accordance with a further preferred development, a layer made of a ferroelectric, preferably made of strontium bismuth tantalate, is provided in a large-area manner over the lower capacitor electrodes and the insulator layer situated in between.

In accordance with yet again another feature of the invention, a common upper capacitor electrode is provided in a large-area manner over the layer made of a ferroelectric. This protects the entire structure from above and obviates structuring into a multiplicity of upper capacitor electrodes.

In accordance with a further preferred development, the trenches of the bit lines, the crowns of the bit lines, the word lines and the insulation trenches each have a minimal structure width F, the zone between two insulation trenches amounts to 2 F and each memory cell occupies a zone of 6 $F^2$.

In accordance with a further preferred development, the respective lower capacitor plate occupies a zone of 2 $F^2$.

In accordance with a concomitant feature of the invention, the respective lower capacitor plate is provided in the transverse direction in the zone between two neighboring bit line trenches and in the longitudinal direction in the zone between a word line and a neighboring insulation trench and in a manner such that it covers in each case half of the word line and of the insulation trench. In this way, the distance F from the nearest neighboring lower capacitor plate can be realized in every direction.

With the above and other objects in view there is also provided, in accordance with the invention, a method of fabricating the above-described memory cell configuration. The fabrication process includes the following steps:

providing a semiconductor substrate and forming mutually parallel insulation trenches (e.g. by STI technology) in a main surface of the semiconductor substrate;

forming bit line trenches with a bottom, side walls, and a crown in the main surface of the semiconductor substrate;

forming bit lines on the bottom of each of the bit line trenches and source/drain regions on the crowns, preferably by simultaneous implantation or diffusion;

forming selection transistors by changing a doping of one of the side walls of the bit line trenches and depositing a gate insulator; and forming word lines transverse to the bit line trenches and capacitors.

In accordance with another feature of the invention, the word lines are formed with the following process steps:

large-area depositing a layer of word line material, such as polysilicon;

forming a hard mask, for instance an oxide mask, corresponding to the word line structure; and etching the word lines using the hard mask.

In addition, the hard mask may be left on a top side of the word lines as an upper insulating spacer; and lateral insulating spacers may be formed. The lateral insulating spacers are formed of either silicon oxide or silicon nitride.

In accordance with another feature of the invention, and insulator layer is deposited and planarized, through holes are formed in the insulator layer for contacting the source/drain regions, and a layer made of the contact plug material is deposited and etched back as far as the insulator layer. The insulator layer is preferably composed of doped silicate glass and a double layer made of undoped oxide or undoped nitride with a doped silicate glass. Furthermore, a conductive barrier layer (e.g. TiN) is deposited on the insulator layer with the contact plugs, a layer of a material of the lower capacitor electrodes (e.g. Pt) is next deposited on the conductive barrier layer; and the conductive barrier layer and the layer on the conductive barrier layer are structured for forming the lower capacitor electrodes.

In accordance with a concomitant feature of the invention, a large-area layer of a ferroelectric material is deposited over the lower capacitor electrodes and the insulator layer, a large-area layer of upper capacitor electrode material (e.g. Pt) is deposited on the layer made of ferroelectric material; and the periphery of the cell array is uncovered. Finally, the cell array may be encapsulated with a further insulator layer.

Other features which are considered as characteristic for the invention are set forth in the appended claims.

Although the invention is illustrated and described herein as embodied in a memory cell configuration and corresponding fabrication method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

Throughout the figures, identical reference symbols designate structurally or functionally identical components.

DESCRIPTION OF THE PREFERRED EMBODIMENTS

Figure 1:
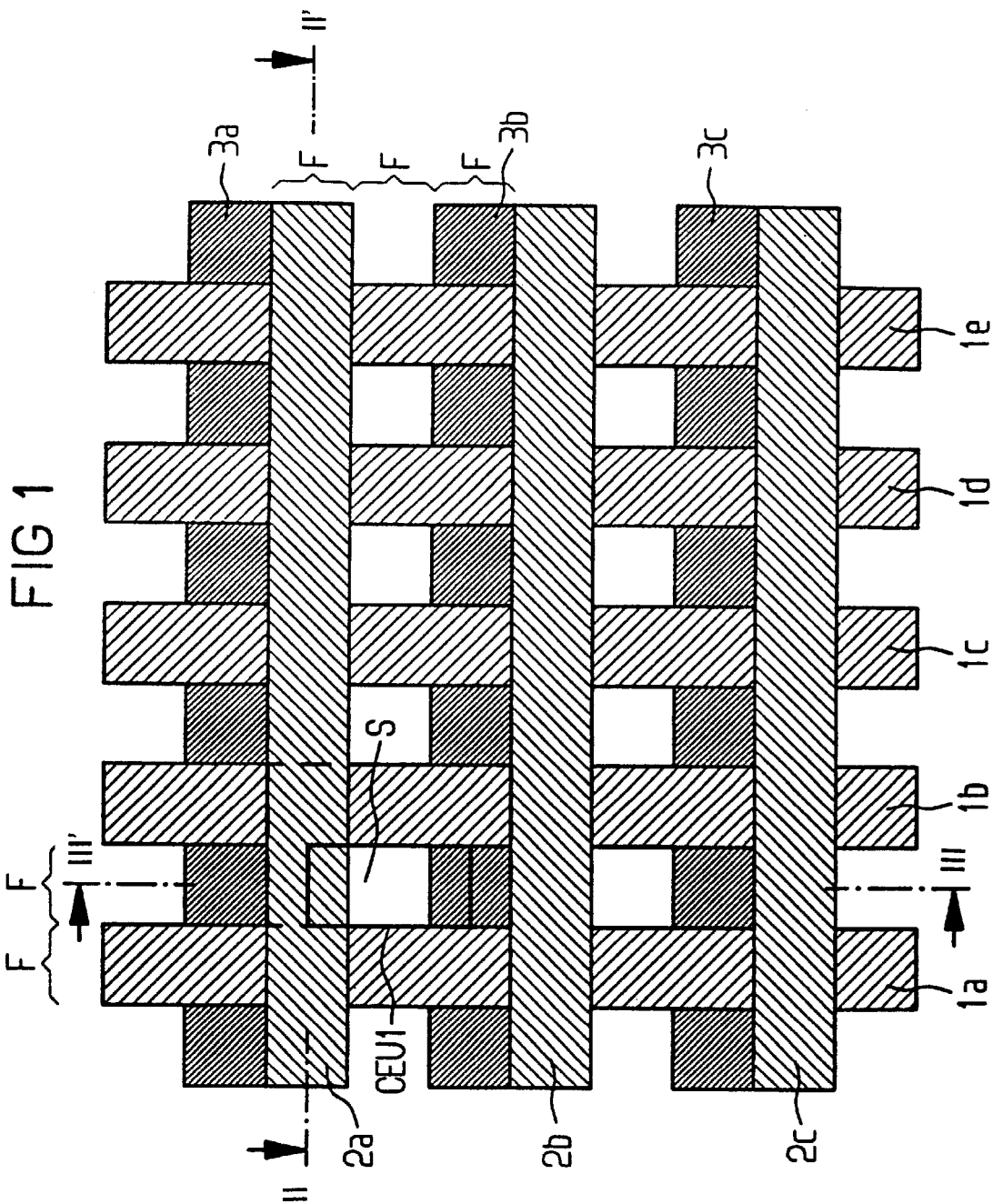
FIG. 1 is a plan view of a cell array in accordance with an embodiment of the memory cell configuration according to the invention.

Referring now to the figures of the drawing in detail and first, particularly, to FIG. 1 thereof, there is seen a plan view of a cell array in accordance with an embodiment of the memory cell configuration according to the invention.

Bit line trenches 1a–1e and word lines 2a–2d extend transversely to each other. Insulation trenches 3a–3d (STI trenches) extend transversely to the bit line trenches 1a–1e. An individual memory cell is identified with S, and F designates the minimum structure width. Furthermore, CEU1 is the lower capacitor electrode of the memory cell S.

In accordance with the illustration of FIG. 1, the cell array has a multiplicity of ferroelectric memory cells S provided in a semiconductor substrate 10. Bit line trenches 1a–1e run parallel to one another in the longitudinal direction III–III' in the main area of the semiconductor substrate 10. A respective bit line (15a–15d in FIG. 2) is provided in the floor of each trench 1a–1e. A respective source/drain region (25a–25d in FIG. 2) is provided in the crowns of the bit line trenches 1a–1e, and a respective channel region (17a–17d; 20a–20d) is provided in the walls of the bit line trenches 1a–1e.

Insulated word lines 2a–2d for driving the selection transistors of the memory cells S, whose structure is explained in more detail in connection with FIG. 2, run in the transverse direction II–II' along the main surface of the semiconductor substrate 10 through the bit line trenches 1a–1e. In addition, insulation trenches 3a–3c for insulating the source/drain regions in the longitudinal direction of neighboring memory cells S run in the transverse direction II–II' in the main surface of the semiconductor substrate 10.

Each memory cell S is assigned a ferroelectric capacitor (CEU1–CEU3; CEO; 70 in FIG. 3), which is connected to the source/drain region (25b, 26b, 27b, 28b in FIG. 3) of the relevant memory cell S and whose structure is explained in more detail in connection with FIG. 3.

The dimension ratios in the cell array according to this embodiment of the memory cell configuration according to the invention are explained in more detail below.

The trenches of the bit lines 1a–1e, the crowns of the bit lines 1a–1e, the word lines 2a–2d and the insulation trenches 3a–3d each have a minimum structure width F (<0.2 mm). The zone between two insulation trenches 3a–3d amounts to 2 F. Each memory cell S consequently occupies a zone of 6 $F^2$.

Furthermore the respective lower capacitor plate CEU1–CEU3 occupies a zone of 2 $F^2$. In this case, the respective lower capacitor plate CEU1–CEU3 is provided in the transverse direction in the zone between two neighboring bit line trenches 1a, 1b and in the longitudinal direction in the zone between a word line 2a and an adjacent insulation trench 3b and in a manner such that it covers in each case half of the word line 2a and of the insulation trench 3b.

Figure 2:
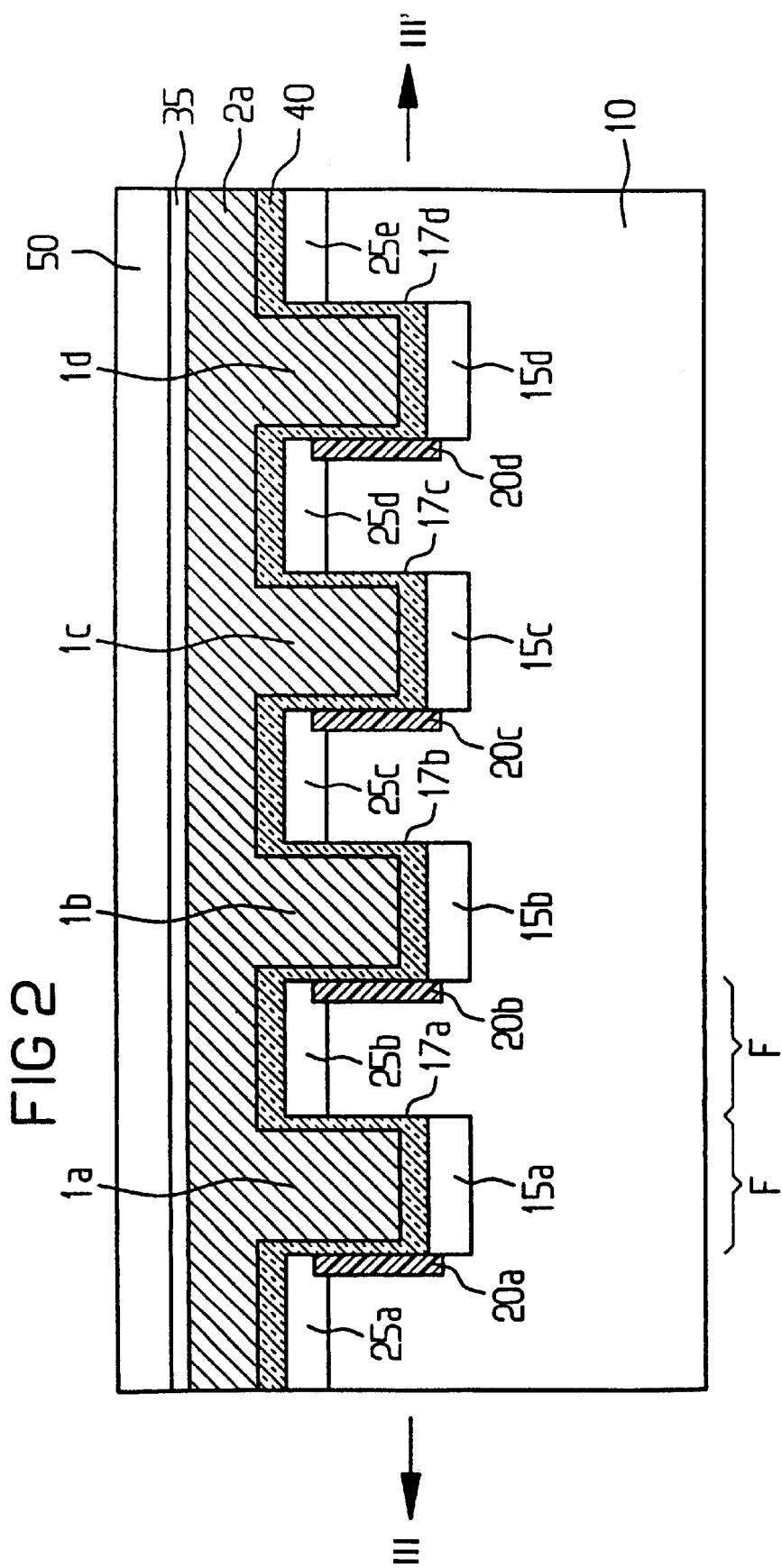
FIG. 2 is a vertical section through the cell array taken along the line III–III' in FIG. 1.

FIG. 2 is a vertical cross-sectional view of the cell array along the line III–III' of FIG. 1.

Referring now more specifically to FIG. 2, the reference numeral 10 designates the semiconductor substrate, 15a–15d designates bit lines, 17a–17d designates open channel regions, 20a–20d designates closed channel regions, 25a–25e designates source/drain regions, 35 designates the upper insulation of the word line, 40 designates a gate oxide and 50 designates an insulator (for example borophosphorus silicate glass). The channel region 17a–17d on one wall of the bit line trenches 1a–1e is in each case configured in such a way that a drivable selection transistor of the relevant memory cell S is formed there (open channel region). In contrast, the channel region 20a–20d on the other wall of the bit line trenches 1a–1e is configured in such a way that the transistor located there is not drivable, that is to say can be driven only with a voltage which is beyond the operating voltage or supply voltage used (closed channel region). For this purpose, the respective channel region 20a–20d on the other wall is doped more heavily than the respective channel region 17a–17d on that one wall.

An oxide layer 40 is provided between the source/drain regions 25a–25d and the channel regions 17a–17d; 20a–20d, on the one hand, and the respective word line 2a–2d, on the other hand.

Figure 3:
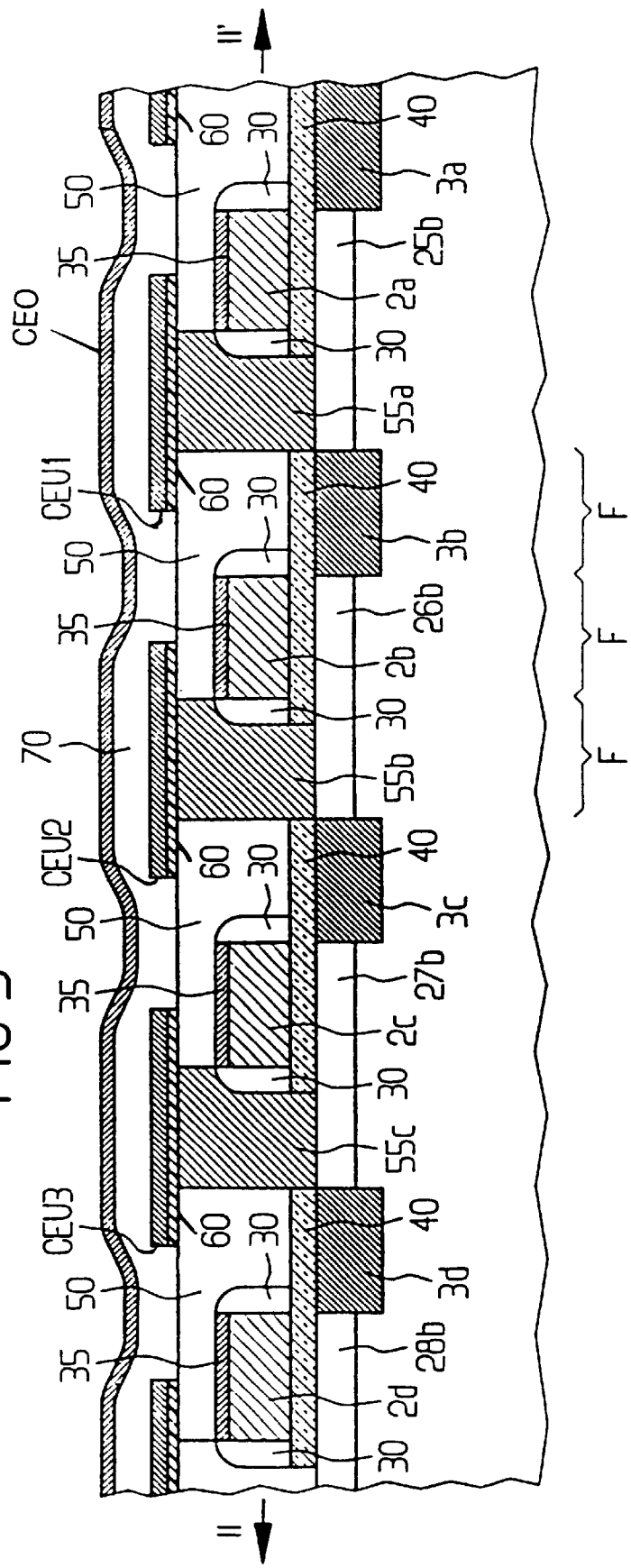
FIG. 3 is a vertical section through the cell array taken along the line II–II' in FIG. 1.

FIG. 3 is a vertical sectional view of the cell array along the line III–III' in FIG. 1.

In FIG. 3, CEU1–CEU3 designate lower capacitor electrodes, CEO designates an upper capacitor electrode, 26b, 27b, 28b designate source/drain regions of further memory cells, 30 designates a lateral insulation of the word lines (for example SiN), 60 designates a barrier layer (for example TiN), 55a–55c designate contact plugs (for example made of polysilicon) and 70 designates a ferroelectric layer (for example strontium bismuth tantalate (SBT) or the like).

The word lines 2a–2d running on the oxide layer 40 have laterally insulating spacers 30 made of silicon nitride. Furthermore, the word lines 2a–2d have an insulating spacer made of silicon oxide on their top side and are thus completely encapsulated.

All the word lines 2a–2d are completely embedded in an insulator layer 50 made of doped silicate glass, for example phosphosilicate glass. Contact plugs 55a–55c made of polysilicon are passed through the insulator layer 50, which plugs each form contact with a source/drain region 25b, 26b, 27b of a selection transistor of a relevant memory cell. In connection with the illustration of FIGS. 1 and 2, the contact plugs 55a–55c are provided on the crowns of the bit line trenches 1a–1e in the zone between the insulation trenches 3a–3d and the word lines 2a–2d. A corresponding lower capacitor electrode CEU1–CEU3 is provided, with an interposed barrier layer, in conjunction with a respective contact plug 55a–55c on the insulator layer 50.

A layer 70 made of a ferroelectric, in this case strontium bismuth tantalate (SBT), is provided in large-area coverage over the lower capacitor electrodes CEU1–CEU3 and the insulator layer 50 situated in between. Finally, a common upper capacitor electrode CEO is provided, in a large-area manner, over the layer 70 made of strontium bismuth tantalate (SBT)

The fabrication method for fabricating the cell array, illustrated in FIGS. 1 to 3, in accordance with the embodiment of the memory cell configuration according to the invention is explained in m ore detail below.

Firstly, the insulation trenches 3a–3c are formed in the main surface of the semiconductor substrate 10. This is preferably done with conventional STI technology. This is followed by the formation of the bit line trenches 1a–1e in the main area of the semiconductor substrate 10 and the formation of the bit lines 15a–15d and of the source/drain regions 25a–25d by simultaneous implantation.

Changing the doping of the respective (left-hand in FIG. 2) walls 20a–20e of the bit line trenches 1a–1e prevents selection transistors from forming there, the selection transistors having formed at the walls 17a–17d. A gate oxide is subsequently grown on (cf. FIG. 2). The order of doping the walls 20a–20e and producing the gate oxide can be interchanged. In this case, the gate oxide acts as a screen oxide.

The subsequent formation of the word lines 2a–2d comprises large-area deposition of a layer made of word line material, in this case polysilicon. On top of this, a hard mask for example made of oxide is provided in a manner corresponding to the word line structure. The word lines 2a–2d are then etched using the hard mask by means of a process known per se. The hard mask is then left on the top side of the word lines as a respective upper insulating spacer. Lateral insulating spacers 30 made of silicon nitride are then formed in order to completely encapsulate the word lines 2a–2d in this way. Subsequent deposition and planarization (for example mechanical polishing) of an insulator layer 50 made of doped silicate glass or a double layer made of undoped oxide or nitride with a doped silicate glass creates a planar surface. Through holes are then formed in the insulator layer 50 for the purpose of making contact with the source/drain regions of the respective memory cells. Afterwards, a layer made of the contact plug material, in this case polysilicon, is deposited and the layer is etched back as far as the insulator layer 50.

The process complex for fabricating the capacitors can then begin. Firstly, a conductive barrier layer 60 for example made of TiN is deposited on the insulator layer 50 with the contact plugs 55a–55c. A layer made of the material of the lower capacitor electrodes CEU1–CEU3, in this case Pt, is subsequently deposited on the barrier layer 60.

The subsequent structuring of the barrier layer 60 and of the layer made of the material of the lower capacitor electrodes CEU1–CEU3 for the purpose of forming the lower capacitor electrodes CEU1–CEU3 is carried out in accordance with known semiconductor process technology.

The large-area deposition of a layer 70 made of the ferroelectric material SBT over the lower capacitor electrodes CEU1–CEU3 and the insulator layer 50 as well as the large-area deposition of a layer made of the material of the upper capacitor electrode CEO, in this case Pt, on the layer made of the ferroelectric material and the uncovering of the periphery and expedient encapsulation of the cell array by a further insulator layer include the essential process steps for fabricating the cell array, illustrated in FIGS. 1 to 3, in accordance with the embodiment of the memory cell configuration according to the invention.

Further possible process steps comprise the customary back end production sequence with deposition of an intermediate layer dielectric with planarization, introduction of contacts and one or more metallization planes. The overall process is usually concluded with a final passivation and a photoimide step.

Although the present invention has been described above with reference to preferred exemplary embodiments, it is not restricted thereto but rather can be modified in diverse ways.

In particular, the specified base materials and additional materials are only by way of example and can be replaced by other suitable materials.

The following other ferroelectric materials can be used, inter alia: lead zirconium titanate, barium titanate, lead lanthanum titanate, strontium bismuth tantalate, bismuth titanate.

The capacitor dielectric is also not restricted to ferroelectrics but rather can be replaced by other suitable dielectrics, for example the paraelectric materials barium strontium titanate, strontium titanate and barium zirconium titanate.

We claim:

1. A method of fabricating a memory cell configuration, which comprises:

providing a semiconductor substrate;

forming mutually parallel insulation trenches in a main surface of the semiconductor substrate;

forming bit line trenches with a bottom, side walls, and a crown in the main surface of the semiconductor substrate;

forming bit lines on the bottom of each of the bit line trenches and source/drain regions on the crowns;

changing a doping of one of the side walls of each one of a plurality of the bit line trenches and depositing a gate insulator such that a respective vertical selection transistor formed at the one of the side walls of each one of the plurality of the bit lines has a threshold voltage that is higher than a threshold voltage of a respective vertical selection transistor formed at another one of the side walls of each one of the plurality of bit line trenches; and forming word lines transverse to the bit line trenches and capacitors.

2. The method according to claim 1, wherein the step of forming the bit lines and source/drain regions comprises a process selected from the group consisting of simultaneous implantation and diffusion.

3. The method according to claim 1, wherein the step of forming the insulation trenches comprises forming the insulation trenches with STI technology.

4. The method according to claim 1, wherein the step of forming the word lines comprises the following steps:

large-area depositing a layer of word line material;

forming a hard mask corresponding to the word line structure; and etching the word lines using the hard mask.

5. The method according to claim 4, wherein the hard mask is an oxide mask.

6. The method according to claim 4, wherein the large-area depositing step comprises depositing polysilicon.

7. The method according to claim 4, wherein the step of forming the word lines further comprises the following steps: leaving the hard mask on a top side of the word lines as an upper insulating spacer; and forming lateral insulating spacers.

8. The method according to claim 7, wherein the lateral insulating spacers are formed of a material selected from the group consisting of silicon oxide and silicon nitride.

9. The method according to claim 1, which comprises:

depositing and planarizing an insulator layer;

forming through holes in the insulator layer for contacting the source/drain regions; and depositing a layer made of the contact plug material and etching back of the layer as far as the insulator layer.

10. The method according to claim 9, wherein the insulator layer is composed of a material selected from the group consisting of doped silicate glass and a double layer made of undoped oxide or undoped nitride with a doped silicate glass.

11. The method according to claim 1, characterized by the following steps:

depositing a conductive barrier layer on the insulator layer with the contact plugs;

depositing a layer of a material of lower capacitor electrodes on the conductive barrier layer; and structuring the conductive barrier layer and the layer on the conductive barrier layer for forming the lower capacitor electrodes.

12. The method according to claim 11, wherein the conductive barrier layer is a TiN layer.

13. The method according to claim 11, wherein the layer on the conductive barrier layer is a Pt layer.

14. The method according to claim 13, which further comprises the following steps:

large-area depositing a layer of a ferroelectric material over the lower capacitor electrodes and the insulator layer;

large-area depositing a layer of a material of an upper capacitor electrode on the layer made of ferroelectric material; and uncovering a periphery of the cell array.

15. The method according to claim 14, wherein the material of the upper capacitor electrode is Pt.

16. The method according to claim 14, which further comprises encapsulation the cell array with a further insulator layer.

* * * * *